United States Patent
Chung et al.

(10) Patent No.: US 7,264,985 B2
(45) Date of Patent: Sep. 4, 2007

(54) PASSIVE ELEMENTS IN MRAM EMBEDDED INTEGRATED CIRCUITS

(75) Inventors: Young Sir Chung, Chandler, AZ (US);
Robert W. Baird, Gilbert, AZ (US);
Mark A. Durlam, Chandler, AZ (US);
Gregory W. Grynkewich, Gilbert, AZ (US); Eric J. Salter, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 11/217,146

(22) Filed: Aug. 31, 2005

(65) Prior Publication Data
US 2007/0045759 A1    Mar. 1, 2007

(51) Int. Cl.
*H01L 21/00* (2006.01)
(52) U.S. Cl. .................. 438/48; 438/48; 438/57; 438/73; 257/421; 257/295; 365/97; 365/173
(58) Field of Classification Search ............... 257/421; 438/48, 57, 73, 128; 365/97, 173
See application file for complete search history.

(56) References Cited

U.S. PATENT DOCUMENTS

| | | | |
|---|---|---|---|
| 6,456,525 B1 | 9/2002 | Perner et al. | |
| 6,631,085 B2 | 10/2003 | Kleveland et al. | |
| 6,829,158 B2 | 12/2004 | Naji | |
| 6,898,106 B2* | 5/2005 | Hoenigschmid et al. | 365/145 |
| 2001/0023992 A1* | 9/2001 | Doll | 257/777 |
| 2004/0207035 A1 | 10/2004 | Witcraft et al. | |
| 2004/0268278 A1* | 12/2004 | Hoberman et al. | 716/5 |
| 2007/0002609 A1* | 1/2007 | Chung et al. | 365/171 |

* cited by examiner

*Primary Examiner*—Andy Huynh
*Assistant Examiner*—Thinh T Nguyen
(74) *Attorney, Agent, or Firm*—Ingrassia Fisher & Lorenz

(57) ABSTRACT

An integrated circuit device (300) comprises a substrate (301) and MRAM architecture (314) formed on the substrate (308). The MRAM architecture (314) includes a MRAM circuit (318) formed on the substrate (301); and a MRAM cell (316) coupled to and formed above the MRAM circuit (318). Additionally a passive device (320) is formed in conjunction with the MRAM cell (316). The passive device (320) can be one or more resistors and one or more capacitor. The concurrent fabrication of the MRAM architecture (314) and the passive device (320) facilitates an efficient and cost effective use of the physical space available over active circuit blocks of the substrate (404, 504), resulting in three-dimensional integration.

3 Claims, 5 Drawing Sheets

PASSIVE ELEMENTS IN MRAM EMBEDDED INTEGRATED CIRCUITS

TECHNICAL FIELD

The present invention relates generally to electronic devices. More particularly, the present invention relates to an integrated circuit device that includes Magnetoresistive Random Access Memory (MRAM) structures and passive device structures formed on a single substrate.

BACKGROUND

In contrast to Random Access Memory (RAM) technologies that use electronic charges to store data, MRAM is a memory technology that uses magnetic polarization to store data. One primary benefit of MRAM is that it retains the stored data in the absence of applied system power, thus, it is a nonvolatile memory. Generally, MRAM includes a large number of magnetic cells formed on a semiconductor substrate, where each cell represents one data bit. Information is written to a bit cell by changing the magnetization direction of a magnetic element within the cell, and a bit cell is read by measuring the resistance of the cell (e.g., low resistance typically represents a "0" bit and high resistance typically represents a "1" bit).

A MRAM device generally includes an array of cells that are programmed using programming lines, often called conductive bit lines and conductive digit lines. MRAM devices are fabricated using known semiconductor process technologies. For example, the bit and digit lines are formed from different metal layers that are separated by one or more insulating and/or additional metal layers. Conventional fabrication processes allow distinct MRAM devices to be easily fabricated on a devoted substrate.

The miniaturization of many modern applications make it desirable to shrink the physical size of electronic devices, integrate multiple components or devices into a single chip, and/or improve circuit layout efficiency. It is desirable to have a semiconductor-based device that includes a MRAM architecture integrated with passive elements, such as resistors and capacitors on a single substrate, where the MRAM architecture and the passive elements are fabricated using the same process technology. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures:

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques and features related to MRAM design, MRAM operation, semiconductor device fabrication, and other aspects of the integrated circuit devices may not be described in detail herein. Furthermore, the circuit/component layouts and configurations shown in the various figures contained herein are intended to represent exemplary embodiments of the invention.

Figure 1:
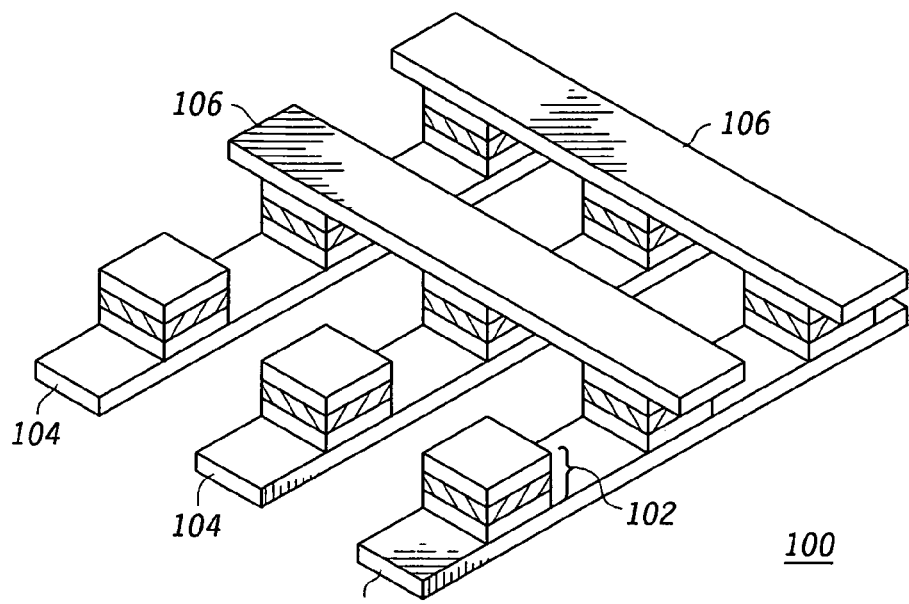
FIG. 1 is a schematic perspective view of a simplified MRAM architecture in accordance with an exemplary embodiment of the invention.

FIG. 1 is a schematic perspective view of a simplified core MRAM bit architecture 100 that is formed on a substrate (not shown) using a suitable semiconductor fabrication process. Although FIG. 1 illustrates a MRAM architecture 100 that includes only nine cells, a typical MRAM device will typically include a much larger number of cells (e.g., millions of cells). Generally, MRAM architecture 100 includes at least one electrode 104 formed from one metal layer, at least one electrode 106 formed from another metal layer, and a Magnetic Tunnel Junction ("MTJ") core 102 formed between the two metal layers. The MTJ core 102 includes cells that form an array of memory locations for MRAM architecture 100.

Figure 2:
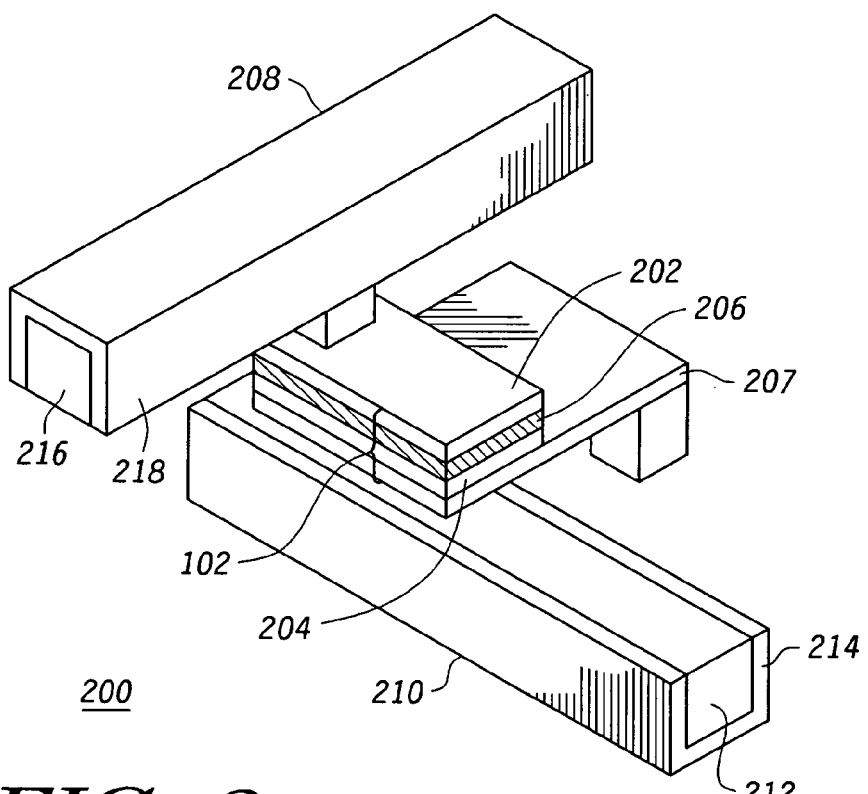
FIG. 2 is a schematic perspective view of a MRAM cell configured in accordance with an example embodiment of the invention.

FIG. 2 is a schematic perspective view of a MRAM cell 200 configured in accordance with an exemplary embodiment of the invention. Some or all cells in MRAM architecture 100 may be configured as shown in FIG. 2. MRAM cell 200 includes an MTJ core 102 having a first ferromagnetic layer 202, a second ferromagnetic layer 204, an insulating layer 206 interposed between the two ferromagnetic layers, and a bottom electrode 207 that is coupled to the second ferromagnetic layer 204. In this example, first ferromagnetic layer 202 is a free magnetic layer because the direction of its magnetization can be switched to change the bit status of MRAM cell 200. Second ferromagnetic layer 204, however, is a fixed magnetic layer because the direction of its magnetization is engineered not to rotate or change directions with normal write fields. When the magnetization in first ferromagnetic layer 202 is parallel to the magnetization in second ferromagnetic layer 204, the resistance across MRAM cell 200 is lower than when the magnetization in first ferromagnetic layer 202 is anti-parallel to the magnetization in second ferromagnetic layer 204. The data (i.e., a "0" or "1") in a given MRAM cell 200 is determined by measuring the resistance of the MRAM cell 200. The techniques utilized to read and write data to MRAM cell 200 are known to those skilled in the art and, therefore, will not be described in detail herein.

FIG. 2 also depicts a bit line 208, which can be formed in a layer known as the Metal Global Interconnect (MGI) layer and a digit line 210, which can be formed in a layer known as the Metal Digital Line (MDL) layer, which will be individually and collectively referred to herein as program lines, corresponding to MRAM cell 200. The orientation of the magnetization in first ferromagnetic layer 202 rotates in response to current magnitude and current direction flowing in digit line 210 and in response to current magnitude and direction flowing in bit line 208. In a typical MRAM cell 200, the orientation of the bit is switched by reversing the polarity of the current in bit line 208 while keeping a constant polarity of the current in digit line 210. In a toggle bit of MRAM cell 200, the orientation of the bit is switched by a sequence of current pulses from the program lines bit line 208 and digit line 210). In an exemplary embodiment, bit line 208 may be connected to any number of similar MRAM cells (e.g., a column of cells) to provide a common write current to each of the connected cells. Similarly, digit line 210 may be associated with any number of similar MRAM cells (e.g., a row of cells) to provide a common digit current to each of the cells. An exemplary matrix configuration is schematically illustrated in FIG. 1.

In the exemplary embodiment shown in FIG. 2, digit line 210 comprises a conductive digit element 212 and a permeable cladding material 214 formed from a soft magnetic material. In this example, cladding 214 partially surrounds conductive digit element 212. In particular, cladding 214 is formed around three sides of conductive digit element 212 such that the inward facing surface of conductive digit element 212 remains uncladded. In the preferred embodiment shown in FIG. 2, bit line 208 includes a conductive bit element 216 and cladding 218 formed from a magnetic material. In this example, cladding 218 is formed around three sides of conductive bit element 216 such that the inward facing surface of conductive bit element 216 remains uncladded. Cladding 214/218 can focus the magnetic flux toward the MTJ 102 to improve the efficiency in programming the MRAM cells 200. The cladding also reduces the write disturbance to neighboring bits. In exemplary embodiments, the magnetic cladding is an integral part of the barrier layers used in the fabrication of conductive program lines, such as copper, used in the MRAM process.

In one exemplary embodiment, conductive digit element 212 and conductive bit element 216 are formed from an electrically conductive material such as copper, and cladding 214/218 is formed from a soft, permeable ferromagnetic materials such as NiFe, a nickel-iron-cobalt alloy, a cobalt-iron alloy, permalloy, or the like. In one example embodiment, cladding 214/218 is within the range of approximately 25 to 2000 Angstroms thick and typically about 50 to 300 Angstroms thick. The sidewalls of cladding 214/218 may be slightly thinner. Although the conductive elements and the cladding are realized from different materials, conductive digit element 212 and cladding 214 are considered to be fabricated at one common metal layer (e.g., the metal four layer), and conductive bit element 216 and cladding 218 are considered to be fabricated at another common metal layer (e.g., the metal five layer).

Figure 3:
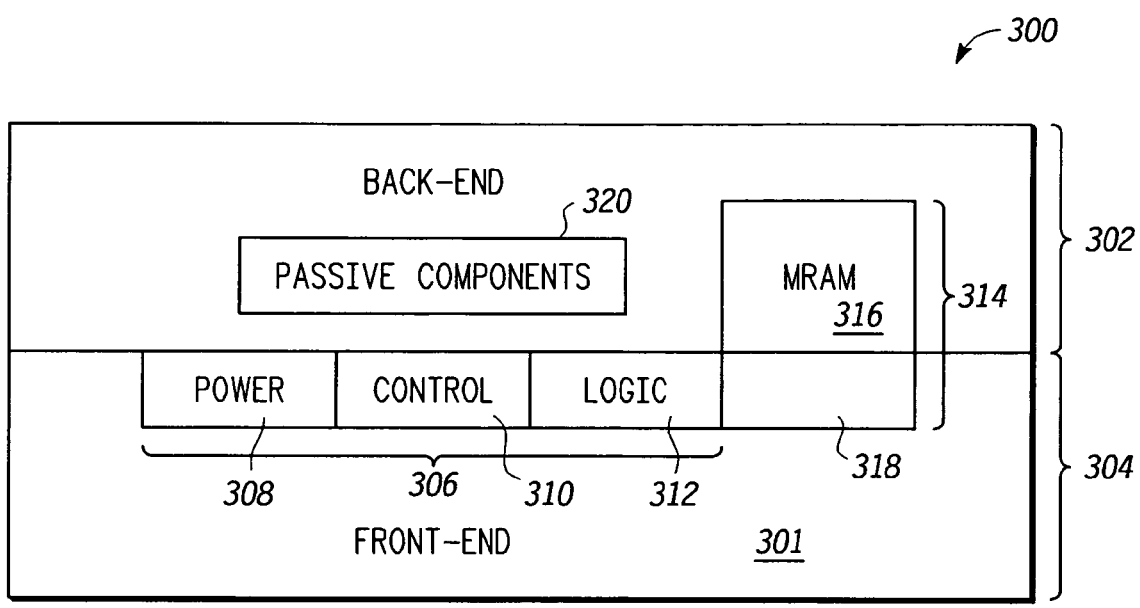
FIG. 3 is a simplified cross sectional view of an integrated circuit device configured in accordance with an example embodiment of the invention.

A cross sectional view of an exemplary embodiment of the present invention is illustrated in FIG. 3. In FIG. 3 an integrated circuit 300 includes a substrate 301, MRAM architecture 314, and smart power components 306. Integrated circuit 300 can be manufactured using a fabrication technology that includes a front end fabrication process and a back end fabrication process. Therefore, integrated circuit 300 can include elements or features that are formed using front end fabrication processes and elements and features that are formed using back end fabrication processes. During the front end fabrication process, various elements or features are formed in front end layers 304 and during the back end fabrication process, various elements or features are formed in back end layers 302. These layers can include metal layers, conductive layers, dielectric layers and other types of layers and can be formed using any of a number of well known fabrication processes. Since front end fabrication processes are completed prior in time to back end fabrication processes, front end layers 304 are located above the substrate 301 but below the back end layers 302.

The MRAM architecture 314 includes a MRAM circuit 318 that is formed in the front end layers 304. The smart power component 306 comprises a power circuit 308; an Analog power control circuit 310 and a logic control circuit 312 are formed on the substrate 301 and are manufactured using a front end fabrication process. In an embodiment of the present invention, the MRAM circuit 318 and the smart power component 306 can be manufactured concurrently during the front end fabrication process. MRAM circuit component 318 may include any number of elements or features that support the operation of MRAM architecture 314, including, without limitation: switching transistors; input/output circuitry; a decoder; comparators; sense amplifiers, or the like.

MRAM cell 316, which is also part of the MRAM architecture 314, and passive components 320 are formed in back end layers 302 using back end fabrication processes. In one exemplary embodiment of the present invention, the materials used to manufacture MRAM cell 316 can also be useful in the fabrication of passive components 320. Thus, passive components 320 can be manufactured concurrently during the front end fabrication process.

MRAM architecture 314 may be generally configured as described above in connection with FIGS. 1 and 2. Indeed, integrated circuit 300 may employ conventional MRAM designs and techniques for MRAM architecture 314, and such conventional features will not be described in detail herein. Generally, as shown in FIG. 3, MRAM architecture 314 includes the MRAM circuit component 318 formed in the front end layers 304 and a MRAM cell 316 formed in the back end layers 302 coupled to MRAM circuit component 318.

In one exemplary embodiment of the invention, power circuit component 308 includes one or more high power MOSFET devices that are configured to operate at high voltages to generate high currents. Alternate embodiments may employ different power generation devices and techniques for power circuit component 308. Digital logic component 312 may be realized with CMOS transistors or any suitable digital logic arrangement. Digital logic component 312 is configured to carry out the digital operations that support the smart power architecture of integrated circuit 300. Analog power control circuit 310 includes analog circuit components configured to support the smart power component of integrated circuit 300. Analog power control component 310 may include, for example, resistors, capacitors, inductors, MOSFETs, bipolar devices, and/or other analog circuit elements.

Passive components 320 are components that do not provide any amplification or gain. In one embodiment of the present invention, passive components 320 can be resistors and capacitors. In the present invention, as discussed previously, the passive components 320 can be constructed during the process steps used to fabricate the MRAM cell 316. Thus, a passive component is formed in conjunction with a MRAM cell 316 when at least part of the passive device is formed in the same layer as an element of MRAM cell 316. The passive components 320 can be used with the smart power components 306.

Figure 4:
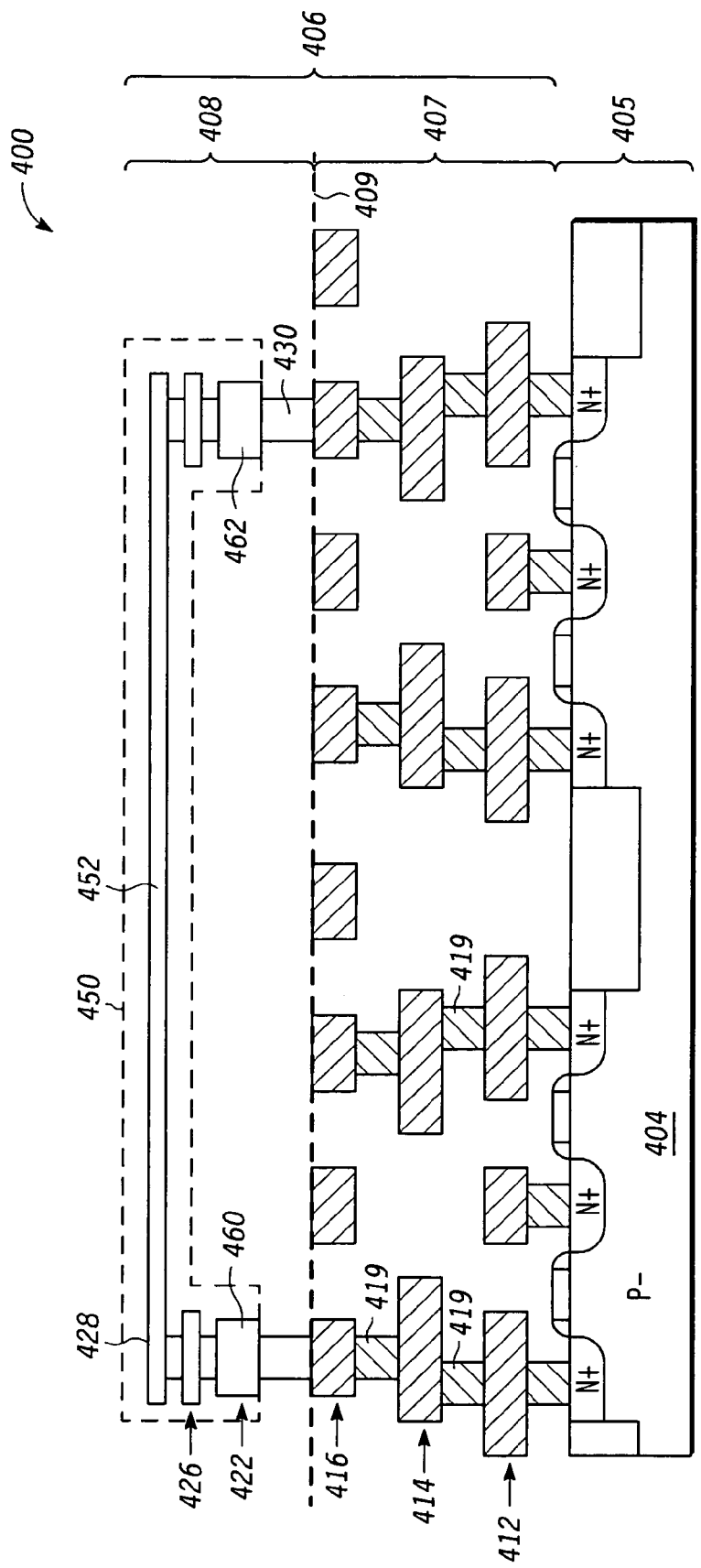
FIG. 4 is a cross sectional view of a resistor fabricated on the same substrate as a MRAM cell in accordance with an exemplary embodiment of the invention.

FIG. 4 is an exemplary embodiment of an integrated circuit 400 that includes a resistor integrated with a MRAM (not shown) and smart power components (not shown). Many of the materials that are used in the manufacture of the MRAM cell also have good resistive qualities. For example, the bottom electrode of the MTJ core (referred to in the specification as a metal MTJ layer or a MMTJ layer), can be used to form a resistor. The material used to manufacture the Metal Local Interconnect (MLI) layer and the materials used to form the MTJ core can serve as resistors. Also, a series of resistors can be formed by connecting resistive elements formed on one or more layers.

Integrated circuit 400 includes a substrate 404, front end layers 405 formed over the substrate 404 and back end layers 406 formed over the front end layers 405. The back end layers comprise first back end layers 407 and second back end layers 408. A dashed line 409 represents a dividing line between the first back end layers 407 and the second back end layers 408. The size of the front end layers 405, the back end layers 406 and the dashed line 409 dividing the first back end layers 407 and the second back end layers 408 are shown for exemplary purposes only and the size can vary.

First back end layers 407 can include a metal one layer 412, a metal two layer 414, and a metal three layer 416 connected by conductive vias 419. The first back end layers 407 may also include various dielectric layers (not shown). The smart power components 306 (not shown in FIG. 4) and the MRAM circuit components 318 (not shown in FIG. 4) are formed in the front end layer 405 and, in some exemplary embodiments, first back end layers 407, using metal one layer 412, metal two layer 414 and metal three layer 416, where appropriate.

Second back end layers 408, in this exemplary embodiment, can include a metal five layer 422, a MMTJ layer 426, a MLI layer 428 and conductive vias 430. The second back end layers 408 also include various dielectric layers, which, for simplicity sake, are not illustrated in FIG. 4. In this exemplary embodiment, both a MRAM cell and a resistor can be fabricated together.

In one exemplary embodiment of the present invention, a resistor 450 is formed in the second back end layers 408. In this exemplary embodiment the resistor 450 includes a resistor element 452. In this exemplary embodiment, resistor element 452 is formed in the MLI layer 428. The MMTJ layer 426 and the MTJ layer (not shown) are used to provide electrical connections and are not used as a resistor. An input 460 and an output 462 are formed at the metal four level 422. As noted before, the digit line 104 of the MRAM is also formed in the metal four level 422. The input 460 and the output 462 are electrically coupled to the substrate for use by the power components.

In one exemplary embodiment, resistor element 452 is manufactured from a thin layer of tantalum nitride (TaN). The resistor 450 is formed over the logic circuitry, which improves the layout efficiency.

Figure 5:
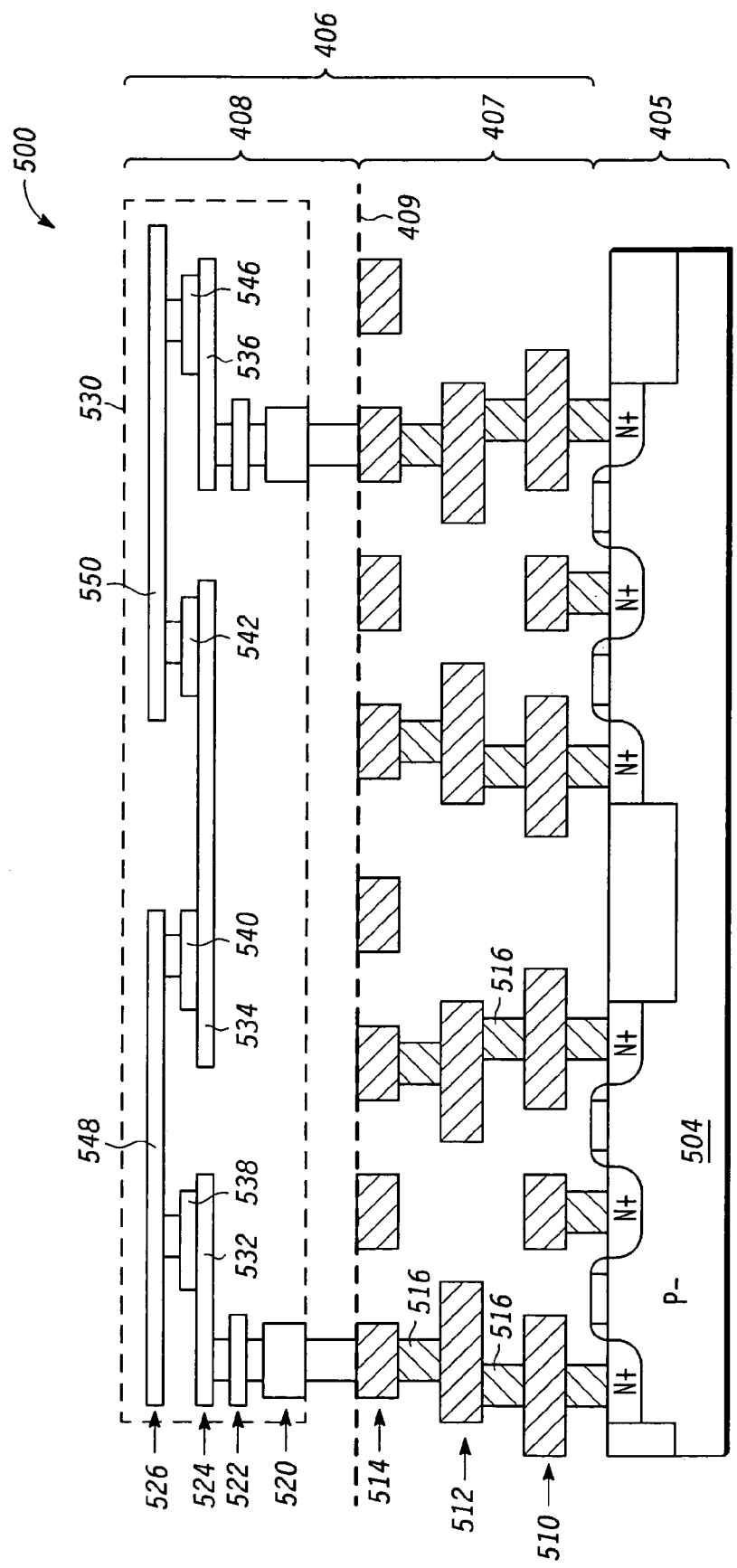
FIG. 5 is a cross sectional view of a resistor fabricated on the same substrate as a MRAM cell in accordance with another exemplary embodiment of the invention.

In another exemplary embodiment, materials in different layers of the back end layers act as resistors in series. FIG. 5 illustrates an integrated circuit 500 having a substrate 504 upon which front end layers 405 are formed. Back end layers 406 are formed over the front end layers 405 and comprise first back end layers 407 and second back end layers 408. Imaginary line 409 divides first back end layers 407 and second back end layers 408.

First back end layers 407 can include a metal one layer 510, a metal two layer 512, and a metal three layer 514. The metal layers are connected by conductive vias 516. First back end layers 407 may also include various dielectric layers (not shown). Smart power components 306 and MRAM circuit components 318 (both not shown) can be formed in the front end layers 405 and, in some designs, in first back end layers 407 using, metal one layer 510, metal two layer 512, and metal three layer 514, when appropriate.

Second back end layers 408, in this exemplary embodiment, can include a metal four layer 520, a MMTJ layer 522, a MTJ layer 524 and a MLI layer 526, connected by vias 528. The MTJ layer 524 is illustrated as a single layer in FIG. 5 but, as illustrated in FIGS. 1-2 and discussed previously, the MTJ layer 524 comprises a first ferromagnetic layer 202, a second ferromagnetic layer 204, and an insulating layer 206 between the two ferromagnetic layers.

In one exemplary embodiment, a resistor 530 is comprised of several individual resistors elements connected in series. A first resistor element 532, a second resistor element 534, and a third resistor element 536 are formed in MMTJ layer 522. As discussed previously, MMTJ layer 522 is the same layer where the bottom electrode of the MRAM can be formed. A fourth resistor element 538, a fifth resistor element 540, a sixth resistor element 542, and a seventh resistor element 546 are formed in the MTJ layer 524, the same layer where the MTJ core 102 is fabricated. An eighth resistor element 548 and a ninth resistor element 550 are formed in the MLI layer 526.

In the exemplary embodiment of FIG. 5, the resistor elements formed in the MTJ layer 524 are formed from the same material as the MTJ core 102 of the MRAM cell 200. Therefore, the resistors fabricated in the MTJ layer 524 can be set to one of the two resistive states depending on if the magnetization in the first ferromagnetic layer 202 is parallel or anti-parallel to the direction of the second ferromagnetic layer 204. Therefore, by switching the magnetization of the first ferromagnetic layer 202, the resistance of resistors formed in the MTJ layer 524 can be adjusted between the two values. Thus, resistor elements in the MTJ layer 524 are adjustable.

In addition, the resistors in the MTJ core 102 can be disabled when excessive voltage is applied. The excessive voltage ruptures the insulating layer 206, which results in the shorting of the resistor element. Those skilled in the art can adapt the exemplary diagrams to allow the isolation of specific resistors thus creating an array of fusable resistors. By using this method, a combination of resistors forming an array can be configured to provide a range of resistor values.

Figure 6:
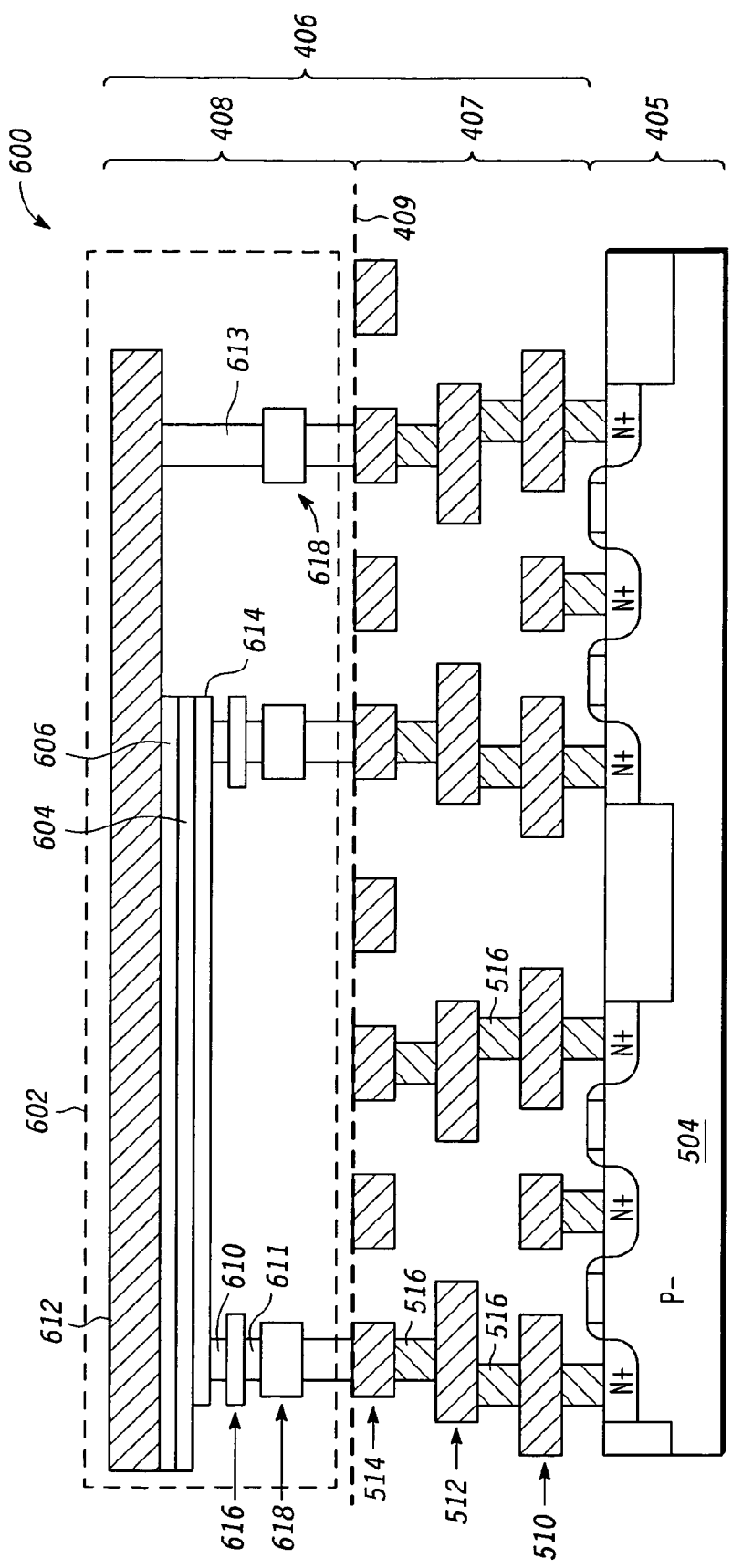
FIG. 6 is a cross sectional view of a capacitor fabricated on the same substrate as a MRAM cell in accordance with another exemplary embodiment of the invention.

In addition to providing resistors that are fabricated on the same integrated circuit as a MRAM device, capacitors can also be integrated with MRAMs and smart power components. FIG. 6 illustrates a capacitor 602 formed in conjunction with a MRAM device (not shown) and on the same integrated circuit 600. Capacitors store electric charge and typically consist of a dielectric material or insulation interposed between two conductors. In an exemplary circuit 600 of FIG. 6, the bottom electrode 614 is formed at the MLI layer. In an exemplary embodiment, the bottom electrode 614 is made from TaN. A dielectric layer is formed over the bottom electrode 614. In one embodiment, the dielectric layer comprises a 1,000 angstrom layer of TEOS (tetraethylorthosilicate derived silicon dioxide) 604 and a 650 angstrom layer of plasma enhanced nitride (PEN) 604. A top electrode 612 is formed over the dielectric layer 604 at the MGI layer. In one exemplary embodiment, the top electrode 612 is made from copper. In the present invention, the bit line 106 of the MRAM can be fabricated at the same layer as the top electrode 612. The bottom electrode 614 can be electrically coupled to the MTJ layer 616 by a first via 610. The top electrode 612 (MGI) is electrically coupled to the metal four layer 618 by a second via 613.

In an alternative embodiment, capacitor 602 can be manufactured using the material of the MLI layer (formerly the bottom electrode 614) as the top electrode and the material of the MTJ layer 616 as the bottom electrode and a dielectric, such as TEOS, between the MTJ layer 616 and the MLI layer 614 where via 610 is shown. In yet another embodiment, capacitor 602 can be manufactured using the material of the MTJ layer 616 of as the top electrode, the material of metal four layer 618 as the bottom electrode and a dielectric, such as PEN and TEOS, in a dielectric layer, where via 611 is typically formed. Additionally, any or all of the above capacitor combinations can be used together.

In the preceding discussion, the elements of the resistors and capacitors were discussed as being formed in specific back end layers. However, the exact name of the back end layers used to fabricate elements of the resistors and capacitors is unimportant in the teachings of the present invention. In the present invention, resistors and capacitors are formed in conjunction with a MRAM cell as long as the MRAM cell and at least one element of the resistor or the capacitor share at least one common layer.

In summary, circuits, devices, and methods configured in accordance with example embodiments of the invention relate to an integrated circuit device comprises a substrate and MRAM architecture formed on the substrate. The MRAM architecture includes a MRAM circuit formed on the substrate; and a MRAM cell coupled to and formed above the MRAM circuit. Additionally a passive device is formed in conjunction with the MRAM cell. In one embodiment, the passive device is a resistor. In another embodiment the passive device is a capacitor. The resistor can be a resistor element formed in the MLI layer, the MMTJ layer, or the MTJ layer. Or the resistor elements can combine in any of several permutations. If the resistor element is fabricated in the MTJ layer, then the resistor element comprises a first ferromagnetic layer, a second ferromagnetic layer, and an insulating layer between the two ferromagnetic layers. The resistance of the resistor element can be set at a high state when the magnetization in the first ferromagnetic layer is anti-parallel to the magnetization in the second ferromagnetic layer and set to a low state when the magnetization in first ferromagnetic layer is parallel to the magnetization in second ferromagnetic layer. Additionally, if the resistor element is formed in the MTJ layer, the resistor element can be shorted by applying excessive voltage to the resistor element of the MTJ layer.

In one exemplary embodiment, the capacitor comprises a top electrode formed in a metal six level, a bottom electrode formed in a MLI level and a dielectric layer formed between the top electrode and the bottom electrode. Alternatively, the capacitor comprises a top electrode formed in an MLI level a bottom electrode formed in an MMTJ layer and a dielectric layer formed between the top electrode and the bottom electrode.

A method of forming an integrated circuit device method comprises forming, on the front end layers of the device, at least one power component; forming, on the front end layers of the device, a MRAM circuit; forming, on the back end layers, a MRAM cell; and forming, on the back end layers, a passive device having a feature found concurrently with a feature of the MRAM cell. The step of forming, on back end layers, a passive device further comprises forming a resistor comprising at least one resistor element on a back end layer on which a feature of the MRAM cell is fabricated. Also, the step of forming, on back end layers, a passive device further comprises forming a capacitor comprising a top electrode, a bottom electrode and a dielectric between the top electrode and the bottom electrode formed on back end layers, wherein at least one of the backend layers where the capacitor is found is associated with a feature of the MRAM cell. If the resistor is formed on a MTJ layer, the resistor element comprising a first ferromagnetic layer, a second ferromagnetic layer, and an insulating layer between the two ferromagnetic layers. The resistance of the resistor element can be set at a high state when the magnetization in the first ferromagnetic layer is anti-parallel to the magnetization in the second ferromagnetic layer and set to a low state when the magnetization in first ferromagnetic layer is parallel to the magnetization in second ferromagnetic layer. Additionally, if the resistor has a resistance, and the resistor comprises a plurality of resistor elements, a portion of the plurality of resistor elements can comprise a resistor element formed on a MTJ layer and a least one of the plurality of resistor elements are formed on the MTJ layer; wherein the resistor elements formed on the MTJ layer can be shorted to change the resistance of the resistor.

An integrated circuit device comprises a substrate; a plurality of first end layers formed over the substrate; a MRAM circuit formed in the plurality of first end layers; one or more power components formed in the plurality of first end layers; and a plurality of back end layers formed over the front end layers. The back end layers include a magnetic random access memory ("MRAM") cell formed in the plurality of back end layers. The MRAM cell is coupled to the MRAM control and comprises at least one digit line, at least one bit line, and a magnetic tunnel junction core coupled between the at least one digit line and the at least one bit line. Further, at least one passive device is formed in the plurality of backend layers, wherein at least part of the passive device is fabricated when at least a portion of the MRAM cell is fabricated. The passive device can have one or more resistors and/or capacitors.

The exemplary embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A method of forming an integrated circuit device on a substrate, said method comprising:
   forming front-end layers of the device on the substrate;
   forming, on the front-end layers of the device, at least one power component;
   forming, on the front end layers of the device, a MRAM circuit;
   forming back-end layers over at least a portion of the front-end layers;
   forming, on the back end layers, a MRAM cell; and
   forming a plurality of resistor elements on back end layer on which a feature of the MRAM cell is fabricated, a portion of the plurality of resistor elements comprising a resistor element formed on a Magnetic Tunnel Junction layer and wherein at least one of the portion of the plurality of resistor elements can be shorted to change the resistance of the resistor.

2. The method of claim 1 wherein the step of forming a plurality of resistor elements further comprises forming a capacitor comprising a top electrode, a bottom electrode and a dielectric between the top electrode and the bottom electrode formed on back end layers, wherein at least one of the backend layers where the capacitor is found is associated with a feature of the MRAM cell.

3. The method of claim 1 wherein the step of forming a plurality of resistor elements includes forming at least a first resistor element comprising a first ferromagnetic layer, a second ferromagnetic layer, and an insulating layer between the two ferromagnetic layers, wherein the resistance of the first resistor element can be set at a high state when the magnetization in the first ferromagnetic layer is anti-parallel to the magnetization in the second ferromagnetic layer and set to a low state when the magnetization in the first ferromagnetic layer is parallel to the magnetization in second ferromagnetic layer.

\* \* \* \* \*